United States Patent [19]

Muraoka

[11] Patent Number: 5,768,204
[45] Date of Patent: Jun. 16, 1998

[54] SEMICONDUCTOR MEMORY DEVICE HAVING DUMMY WORD LINES AND METHOD FOR CONTROLLING THE SAME

[75] Inventor: Kazuyoshi Muraoka, Yokohama, Japan

[73] Assignee: Kabushiki Kaisha Toshiba, Tokyo, Japan

[21] Appl. No.: 661,948

[22] Filed: Jun. 11, 1996

[30] Foreign Application Priority Data

Jun. 12, 1995 [JP] Japan .................................. 7-144329

[51] Int. Cl.$^6$ .................................................. G11C 7/00
[52] U.S. Cl. .................................... 365/210; 365/149
[58] Field of Search .................................. 365/149, 210

[56] References Cited

U.S. PATENT DOCUMENTS 4,977,542 12/1990 Matsuda et al. ........................ 365/210
5,307,315 4/1994 Oowaki et al. ..................... 365/189.09
5,377,152 12/1994 Kushiyama et al. ..................... 364/149
5,418,750 5/1995 Shiratake et al. ......................... 365/63

Primary Examiner—David C. Nelms
Assistant Examiner—Michael T. Tran
Attorney, Agent, or Firm—Loeb & Loeb LLP

[57] ABSTRACT

Memory cells and a sense amplifier are connected to a pair of bit lines. Two dummy word lines are capacitively coupled with the pair of bit lines. One of the dummy word lines is driven to a high level before the sense amplifier starts the sense operation, and the other dummy word line is driven to a high level after the sense amplifier has started the sense operation. When the sense amplifier has terminated the sense operation, the two dummy word lines are driven to a low level.

20 Claims, 8 Drawing Sheets

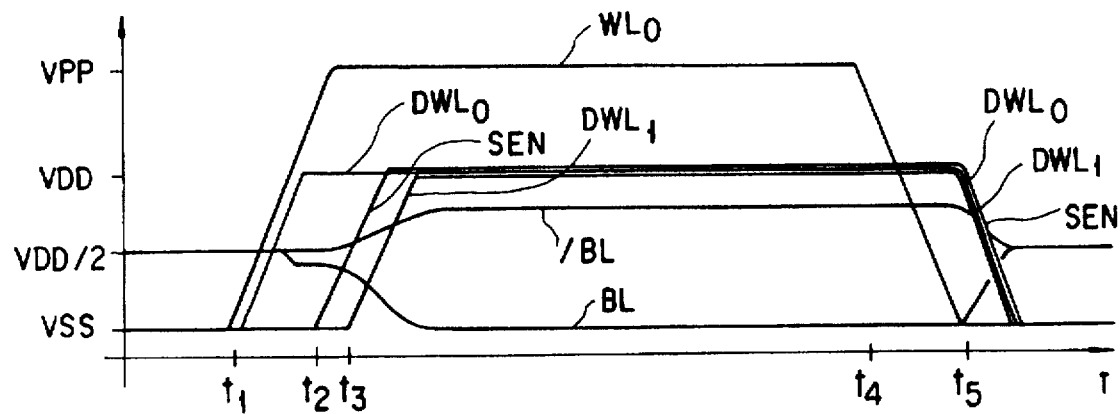
F I G. 2
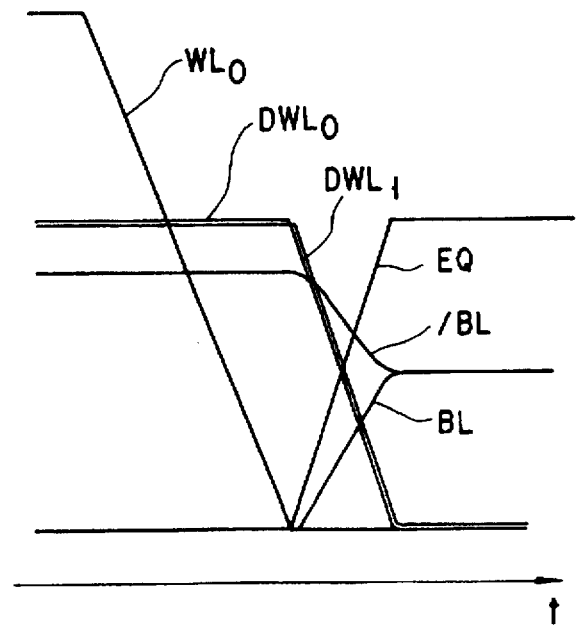
F I G. 3

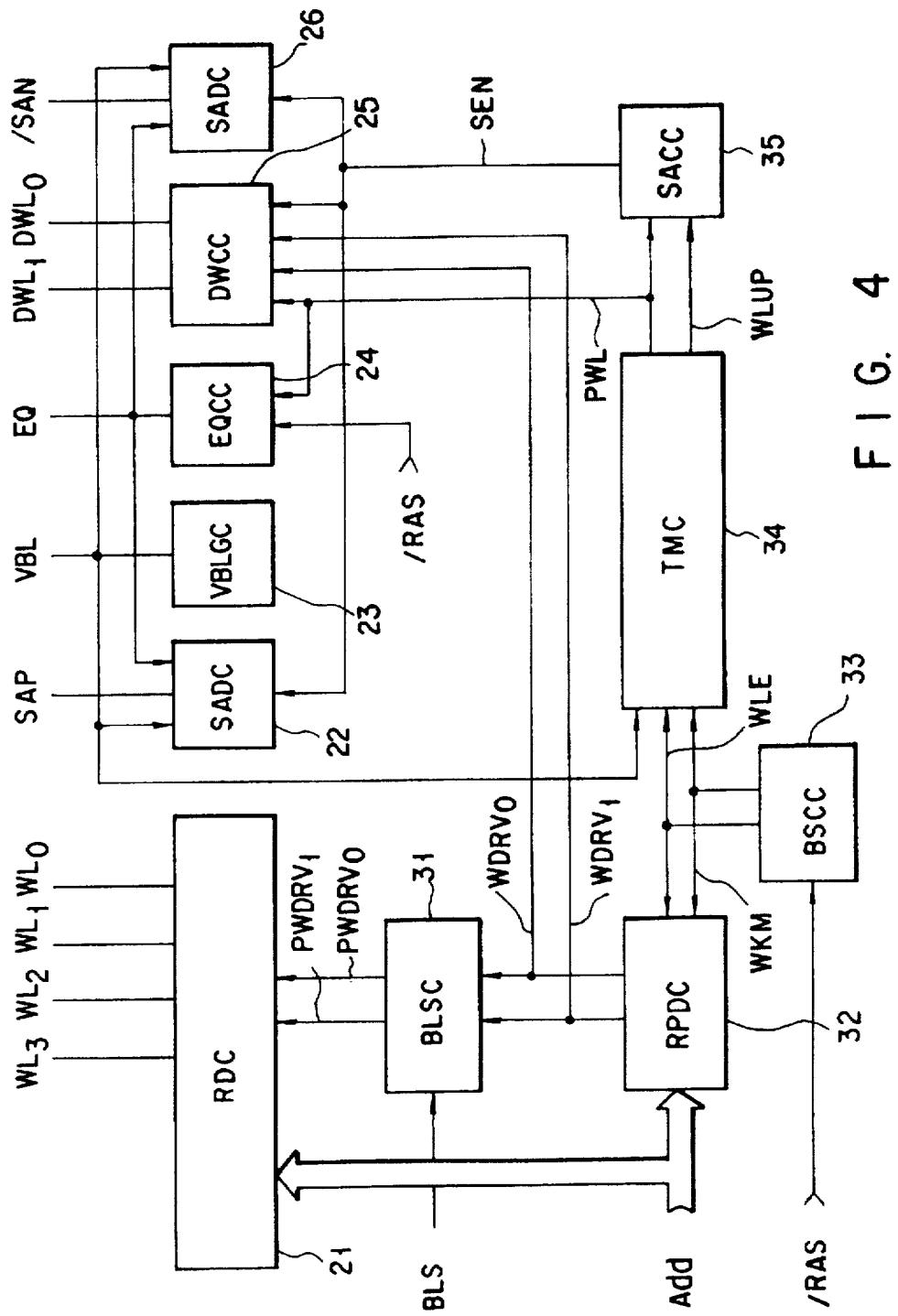
F I G. 4

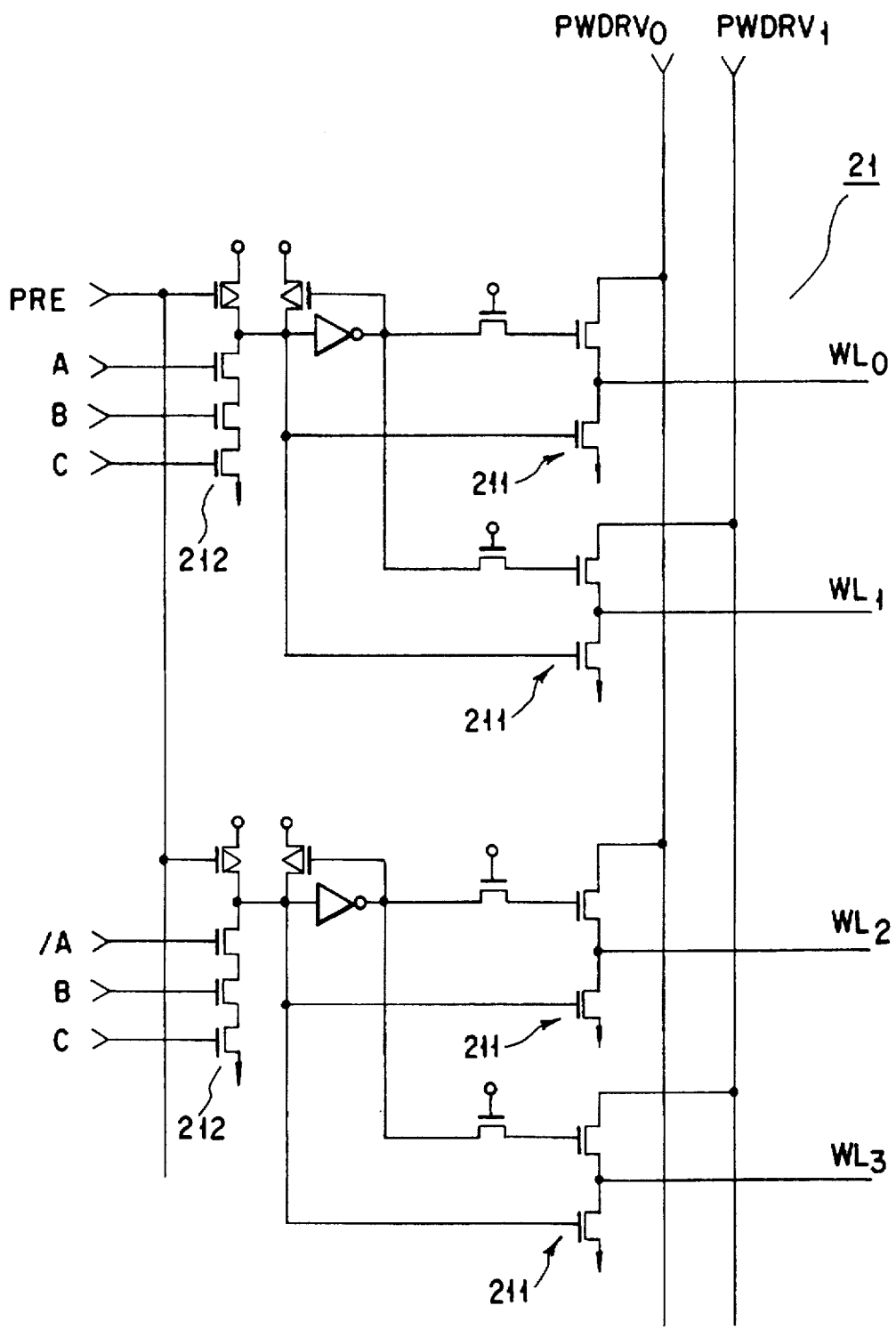
F I G. 7

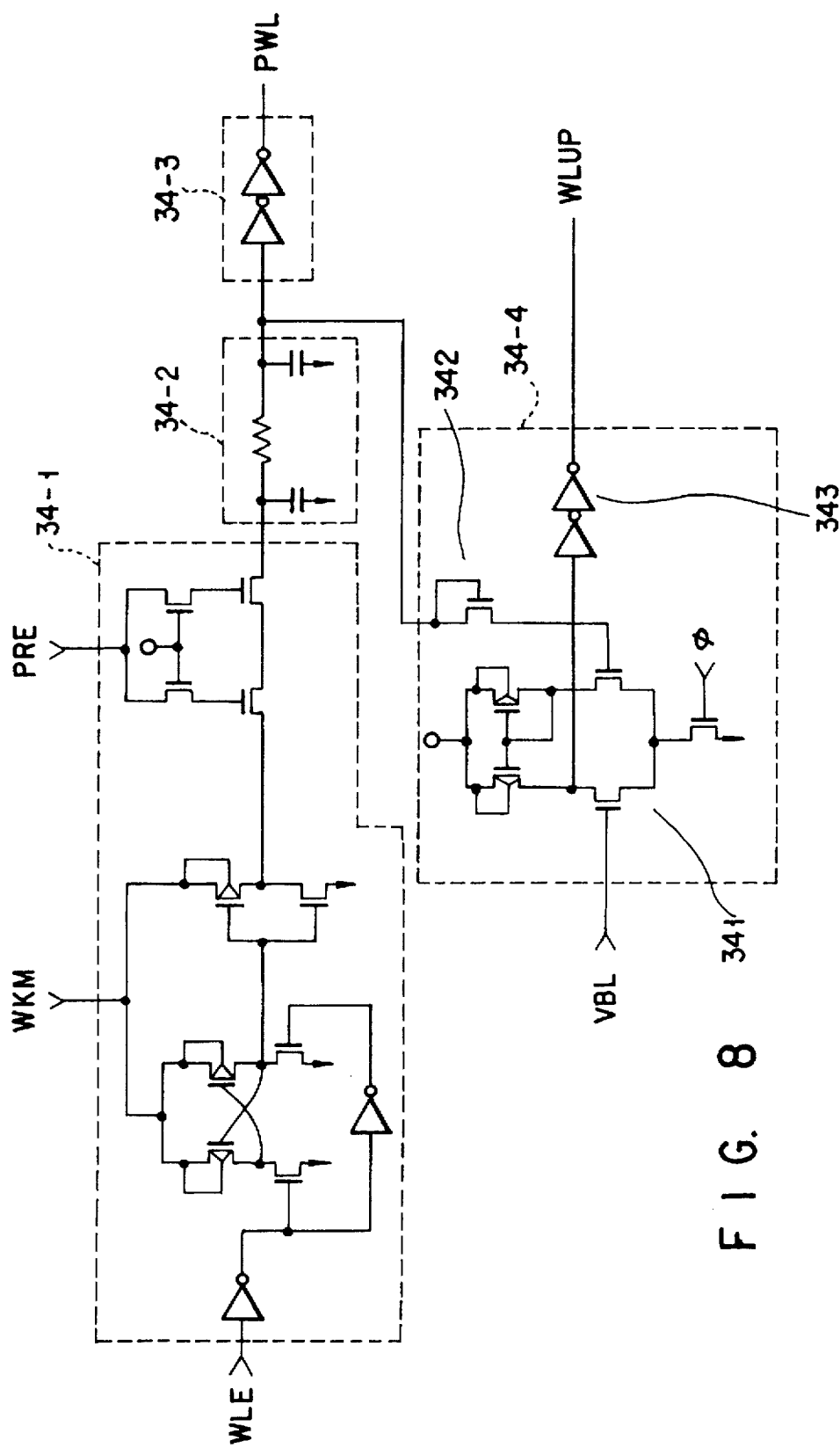
F I G. 8

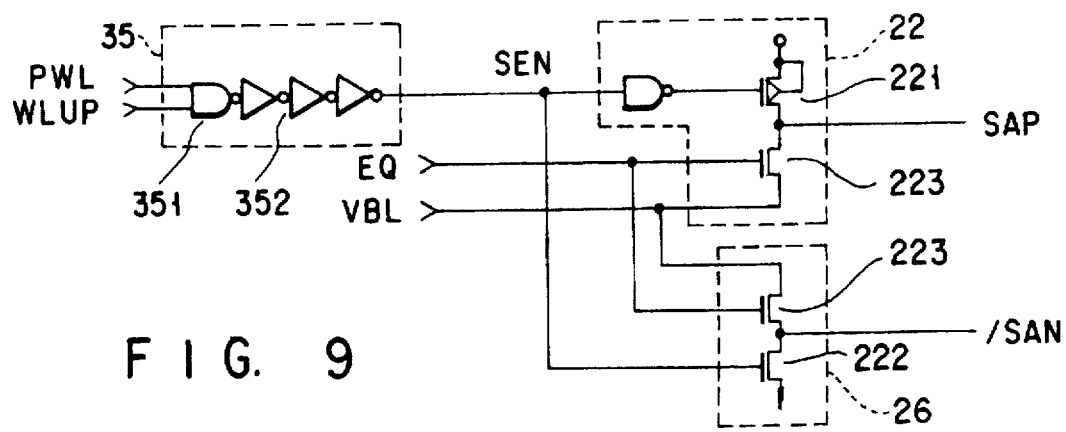
F I G. 9
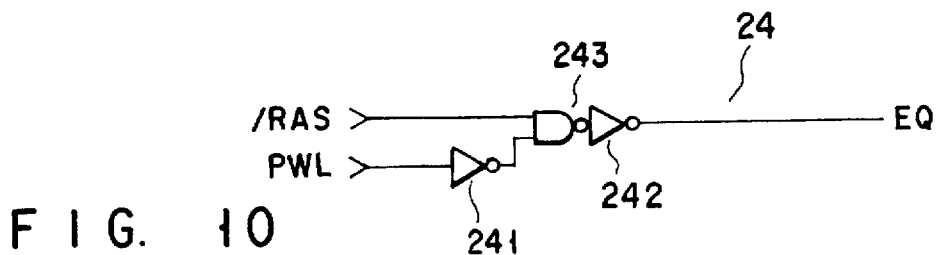
F I G. 10
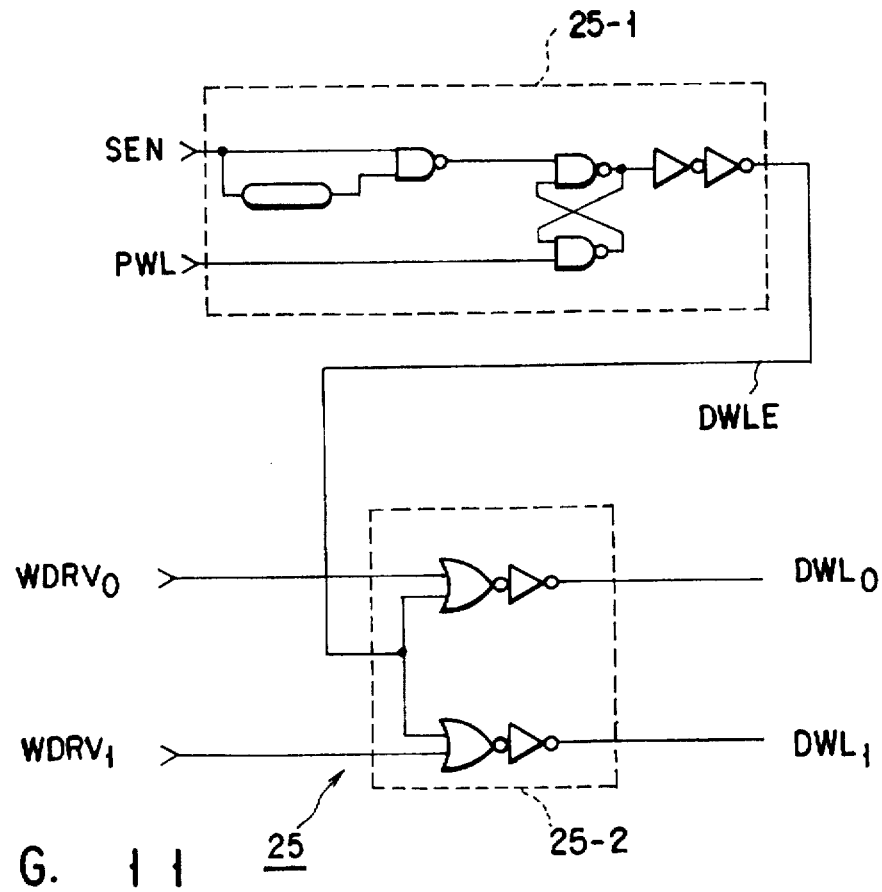
F I G. 11

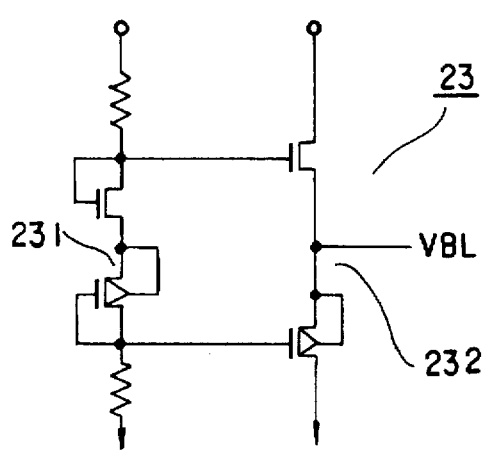
F I G. 12
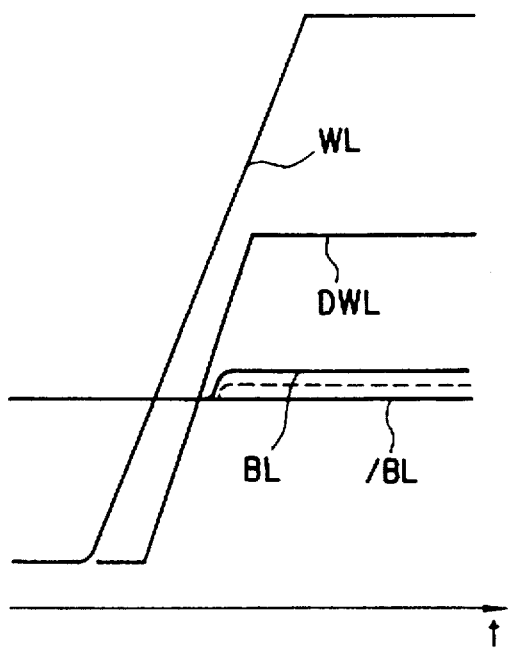
F I G. 13
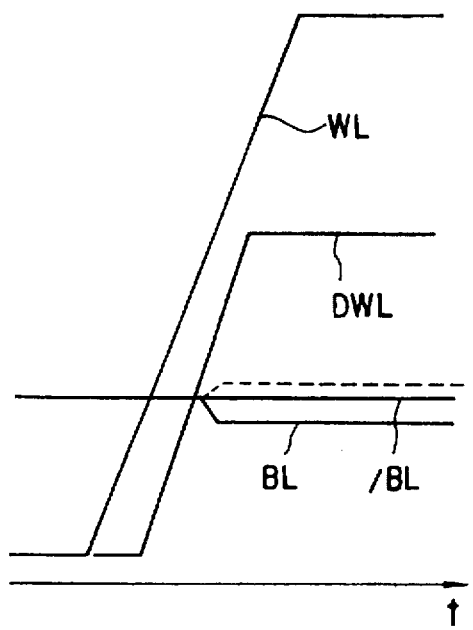
F I G. 14
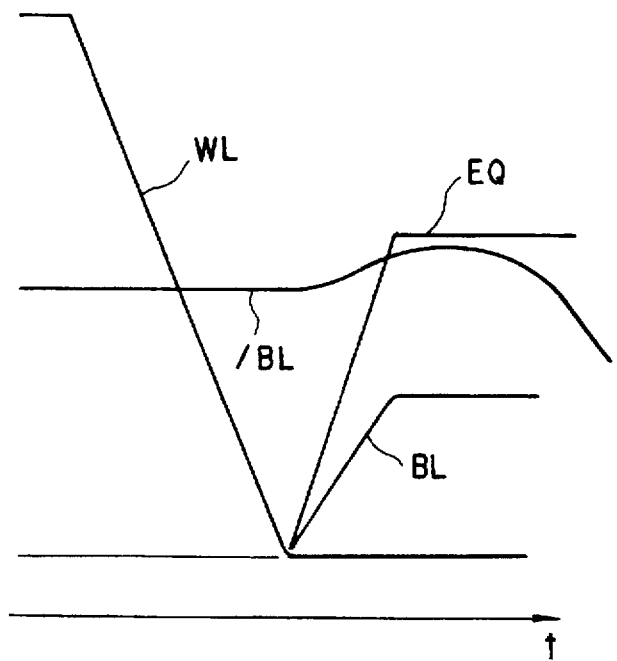
F I G. 15

SEMICONDUCTOR MEMORY DEVICE HAVING DUMMY WORD LINES AND METHOD FOR CONTROLLING THE SAME

BACKGROUND OF THE INVENTION

1. Field of the Invention

This invention relates to a semiconductor memory device and a method for controlling the same, and more particularly to the improvement of the readout margin of a dynamic random access memory (which is hereinafter referred to as a DRAM) attained by using dummy word lines to compensate for the readout characteristic at the time of readout of data in a DRAM cell to a bit line or data holding characteristic.

2. Description of the Related Art

A DRAM has a memory cell array. The memory cell array has a plurality of memory cells which are each constructed by a one-transistor/one-capacitor unit and are arranged in a matrix form. The DRAM stores information according to the amount of charge stored on the capacitor. If the storage node of the capacitor is held at a power supply potential VDD, for example, 3 V, the memory cell stores data "1" and if the storage node is held at the ground potential VSS (0V), the memory cell stores data "0".

In many cases, the capacitor of the DRAM cell is constructed by a MOS capacitor. Since one of the electrodes of the MOS capacitor is formed of a semiconductor such as polysilicon or a silicon substrate having an impurity doped therein, the capacitance thereof varies according to the amount of charge applied to the storage node. As a result, the readout sensitivity becomes different for the data "1" readout operation and the data "0" readout operation. For example, in a case where the capacitor of the DRAM cell is formed of an N-type diffusion layer formed on a P-type semiconductor substrate surface and a polysilicon layer formed thereon with an insulating film disposed therebetween, the N-type diffusion layer is used as the storage node and the polysilicon layer is used as a plate electrode to which a preset potential, for example, ½ VDD is applied, the effective capacitance of the capacitor becomes smaller when data "1" is held than when data "0" is held. As a result, if the memory cell is connected to a bit line having a preset parasitic capacitance, a relatively large variation in the potential in the negative direction is observed when data "0" is held and a smaller variation in the potential in the positive direction is observed when data "1" is held.

As described above, an unbalance occurs in the sensitivity between the data "1" readout operation and the data "0" readout operation. Therefore, in order to compensate for the unbalance, it is necessary to apply a potential of a certain level when data on the low sensitivity side is read out. In the above-described example, it is necessary to simplify the data "1" readout operation. That is, the potential of a bit line to which a memory cell to be read out is connected is set to a high level before the start of the sense amplifying operation by the sense amplifier. Dummy word lines are used to change the bit line potential in a desired direction before the start of the sense amplifying operation.

FIG. 13 shows the data readout operation using a dummy word line. That is, FIG. 13 is a diagram showing waveforms of the potentials of a word line WL, dummy word line DWL, and bit lines BL, /BL when the potential of the bit line BL to which a memory cell to be read out by use of the dummy word line is connected is slightly raised and data "1" is read out. Assume now that a capacitor which holds data "1" has a capacitance ⅓ times that of a capacitor which holds data "0". Originally, the potential of the bit line BL is raised by 0.2 V, for example, by reading out data "1" as shown by broken lines in FIG. 13. However, in this case, the potential of the bit line BL is further raised by 0.2 V by the capacitive coupling between the dummy word line DWL and the bit line BL as shown by a solid line in FIG. 13. As a result, the sense amplifier senses a potential difference of 0.4 although it is originally required for the sense amplifier to sense a potential difference of 0.2 V at the time of data "1" readout, and thus the sense margin is significantly enhanced.

FIG. 14 is a diagram showing waveforms of the potentials of the word line WL, dummy word line DWL, and bit lines BL, /BL when the potential of the bit line BL to which a memory cell to be read out by use of the dummy word line is connected is slightly raised and data "0" is read out. Since it is assumed that a capacitor which holds data "1" has a capacitance ⅓ times that of a capacitor which holds data "0", originally, the potential of the bit line BL is lowered by 0.6 V, for example, by reading out data "0". However, the potential of the bit line BL is raised by 0.2 V by the capacitive coupling between the dummy word line DWL and the bit line BL as shown by broken lines in FIG. 14. As a result, the potential of the bit line BL is lowered by 0.4 V. It is originally possible for the sense amplifier to sense a potential difference of 0.6 V but the sense amplifier senses a potential difference of 0.4 V by the action of the dummy word line DWL, and thus the sense margin is narrowed.

As described above, in order to compensate for the unbalance of the readout characteristic, it is preferable to lower the sensitivity of a cell in which a level which can be easily read out is held and raise the sensitivity of a cell in which a level which is difficult to read out is held. In the above example, the sense margins for data "1" and data "0" can be made equal by lowering the readout sensitivity for data "0" and raising the readout sensitivity for data "1". The readout sensitivity of the memory cell for data "0" or data "1" which is lowered is determined depending on the structure of the memory cell such as the stack type, trench type, reverse trench type, and substrate plate type. However, generally, the technical idea for compensating for the unbalance by use of the dummy word line is the same as that described above irrespective of the structure of the memory cell.

The following problem lies in the conventional method of using the dummy word line. The problem occurs when the data readout operation is terminated and a signal /SAN supplied to the common source node of two transistors constructing the sense amplifier is changed from the ground potential VSS to the precharge level (VDD/2) for equalization. That is, when data "0" is read out, the potential of the bit line BL is set at the ground potential VSS and the potential of the bit line /BL is set at the power supply voltage VDD. However, the transistor of the sense amplifier which is connected to the bit line BL is set in the conductive state and the channel is formed. Therefore, the transistor acts as a capacitance element, and the potential of the bit line /BL is forcedly raised from VDD as shown in FIG. 15. That is, the potential of the bit line BL starts to be changed from the ground a control method for a semiconductor memory device having a pair of bit lines to which a plurality of memory cells and a sense amplifier are connected and two dummy word lines capacitively coupled to the pair of bit lines, comprising the steps of driving one of the dummy word lines to a first level before the sense amplifier starts the sense operation; driving the other dummy word line to the first level after the sense amplifier has started the sense operation; and driving the dummy word lines to a second level when the sense amplifier has terminated the sense operation.

According to this invention, since the first dummy word line is driven to adjust the unbalance in the readout operation of the memory cell and the second dummy word line is activated at the time of sense amplifier operation, no influence is given to the readout operation. Further, after termination of the sense amplifier operation, the first and second dummy word lines are deactivated to prevent a change in the potential of the second bit line. As a result, the unbalance of the readout operations can be compensated for and high-speed operation can be effected. Further, the semiconductor memory device is suitable for low-voltage operation, and deteriorations in various characteristics such as the pause time and refresh time can be prevented. are increased, thereby making it difficult to attain high-speed operation. Further, the operation margin in the low-voltage operation is narrowed and the pause time characteristic and the refresh time characteristic are degraded.

SUMMARY OF THE INVENTION

An object of this invention is to provide a semiconductor memory device which can compensate for an unbalance of the bit line potentials at data readout time, can be operated at a high speed and is adequate for low-voltage operation without causing deteriorations in various characteristics such as the pause time and refresh time, and a control method for the semiconductor memory device.

The above object can be attained by a semiconductor memory device comprising a pair of bit lines to which a plurality of memory cells and a sense amplifier are connected; and two dummy word lines capacitively coupled to the pair of bit lines; wherein one of the dummy word lines is driven to a first level before the sense amplifier starts the sense operation, the other dummy word line is driven to the first level after the sense amplifier has started the sense operation, and the dummy word lines are driven to a second level different from the first level when the sense amplifier has terminated the sense operation.

Further, the above object can be attained by potential VSS to the precharge level (VDD/2) at the starting time of equalization, and at the same time, the signal /SAN is changed to the precharge level (VDD/2). For this reason, the potential of the bit line /BL is raised to a higher level. As a result, the recovery operation is delayed, the precharge time is increased, and the cycle time becomes long. This is not desirable for high-speed operation.

The above problems become significant when the internal power supply voltage becomes low. That is, time required for equalization of the bit lines becomes longer, and in an extreme case, it becomes impossible to effect the readout operation in the next cycle. This causes the operation margin at the low voltage to be narrowed.

Further, a rise in the equalization potential for the bit lines causes the initial potential difference of the bit line to be changed at the data readout time. This lowers the sense sensitivity for data "1" and deteriorates the pause time characteristic (which is proportional to time in which data can be held without refreshing) caused by data "1" and refresh time characteristic.

As described above, in a case where the unbalance of the readout sensitivity for data "1" and data "0" is compensated for by use of the dummy word line in the conventional DRAM, the precharge time and cycle time

Brief Description of the Drawinqs

The accompanying drawings, which are incorporated in and constitute a part of the specification, illustrate a presently preferred embodiment of the invention and, together with the general description given above and the detailed description of the preferred embodiments given below, serve to explain the principles of the invention.

FIG. 2 is a waveform diagram for illustrating the operation of this invention;

FIG. 3 is a waveform diagram showing an enlarged portion in FIG. 2;

FIG. 4 is a circuit construction diagram showing the whole portion of a row control system;

FIG. 7 is a circuit diagram showing a row decoder;

FIG. 8 is a circuit diagram showing a timer circuit;

FIG. 9 is a circuit diagram showing a sense amplifier control circuit and sense amplifier driving circuit;

FIG. 10 is a circuit diagram showing an equalization control circuit;

FIG. 11 is a circuit diagram showing a dummy word line selecting/driving circuit;

FIG. 12 is a circuit diagram showing an intermediate potential generator circuit;

FIG. 13 is a waveform diagram for illustrating the readout operation of a DRAM using dummy word lines;

FIG. 14 is a waveform diagram for illustrating the readout operation of a DRAM using dummy word lines; and FIG. 15 is a waveform diagram for illustrating the equalizing operation of a DRAM using dummy word lines.

DETAILED DESCRIPTION OF THE PREFERRED EMBODIMENTS

There will now be described an embodiment of this invention with reference to the accompanying drawings.

Figure 1:
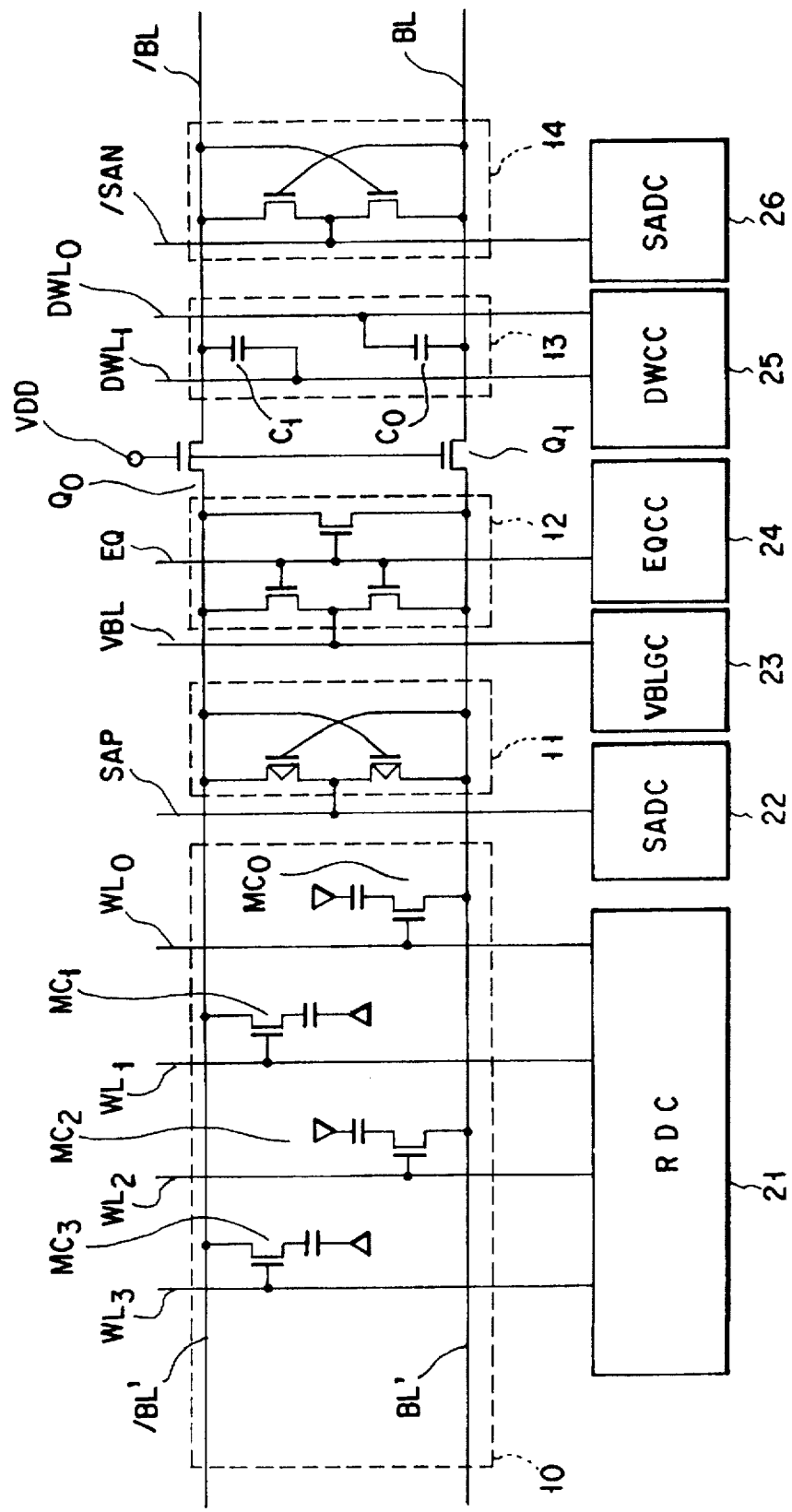
FIG. 1 is a circuit construction diagram showing a core portion of a DRAM relating to an embodiment of this invention.

FIG. 1 shows the circuit construction of the core portion of a DRAM according to an embodiment of this invention. Bit line pairs are divided into two regions. A pair of bit lines BL', /BL' are arranged in a first region and a pair of bit lines BL, /BL are arranged in a second region. An N-channel MOS transistor $Q_0$ is connected between the bit lines BL' and BL and an N-channel MOS transistor $Q_1$ is connected between the bit lines /BL' and /BL. The gates of the MOS transistors $Q_0$, $Q_1$ are applied with a potential VDD directly or via a transistor (not shown) when the bit line is selected.

Memory cells each constructed by a transfer transistor and a capacitor are connected to the pair of bit lines BL', /BL'. That is, memory cells $MC_0$, $MC_2$ are connected to the bit line BL', and memory cells $MC_1$, $MC_3$ are connected to the bit line /BL'. The capacitor of each of the memory cells has a storage node and a plate electrode. The storage node is formed of a diffusion layer formed by diffusing an impurity into a semiconductor substrate (not shown) and the plate electrode is formed of polysilicon. The plate electrode is disposed to face the storage node with an insulating film disposed therebetween. The gates of the transfer transistors constructing the memory cells $MC_0$ to $MC_3$ are respectively connected to word lines $WL_0$ to $WL_3$. The memory cells are arranged in row and column directions to constitute a memory cell array 10. FIG. 1 shows only part of the memory cell array.

A P-type sense amplifier 11 is connected between the paired bit lines BL' and /BL'. The sense amplifier 11 has two P-channel MOS transistors serially connected between the paired bit lines BL' and /BL' and the gates of the transistors are connected to the bit lines BL' and /BL' in a cross-coupled configuration. The sources of the transistors which are commonly connected are connected to a P-type sense amplifier driving line SAP.

An equalizing circuit 12 is connected to the paired bit lines BL' and /BL'. The equalizing circuit 12 includes three N-channel MOS transistors whose gates are commonly connected to an equalizing signal line EQ. The equalizing circuit 12 selectively connects the paired bit lines to a bit line potential supply line VBL according to the potential level of the equalizing signal line EQ. The potential of the bit line potential supply line VBL is set to an intermediate potential VDD/2.

A dummy capacitance portion 13 is connected to the paired bit lines BL and /BL. The dummy capacitance portion 13 is constructed by a first dummy word line $DWL_0$ connected to the bit line BL via a capacitor $C_0$ and a second dummy word line $DWL_1$ connected to the bit line /BL via a capacitor $C_1$.

An N-type sense amplifier 14 is connected between the paired bit lines BL and /BL. The N-type sense amplifier 14 has two N-channel MOS transistors serially connected between the paired bit lines BL and /BL and the gates of the transistors are connected to the bit lines BL and /BL in a cross-coupled configuration. The sources of the transistors which are commonly connected are connected to an N-type sense amplifier driving line /SAN.

The paired bit lines are connected to a data line (not shown) via a column selection gate and readout data is transferred to an output buffer (not shown) via the data line. Further, write data is transferred from an input buffer (not shown) to the paired bit lines via the data line.

A row decoder (RDC) 21 is connected to the word lines $WL_0$ to $WL_3$ to selectively drive the word lines $WL_0$ to $WL_3$. A sense amplifier driving circuit (SADC) 22 is connected to the P-type sense amplifier driving line SAP to selectively drive the driving line SAP. A VBL generator circuit (VBLGC) 23 is connected to the bit line potential supply line VBL to apply the intermediate potential VDD/2 to the supply line VBL. An equalization control circuit (EQCC) 24 is connected to the equalizing signal line EQ to control the equalizing circuit 12. A dummy word line control circuit (DWCC) 25 is connected to the first and second dummy word lines $DWL_0$ and $DWL_1$ to drive the first and second dummy word lines $DWL_0$ and $DWL_1$. A sense amplifier driving circuit (SADC) 26 is connected to the N-type sense amplifier driving line /SAN to selectively drive the driving line /SAN.

FIG. 2 is a waveform diagram for illustrating the operation of the DRAM and shows variations in the potentials of the word lines $WL_0$, first and second dummy word lines $DWL_0$ and $DWL_1$, and paired bit lines BL and /BL with time. The DRAM starts the readout operation in response to a row control signal such as a row address strobe signal (which is hereinafter referred to as a /RAS signal) input from the exterior. In this case, it is assumed that readout data is "0". SEN denotes a sense amplifier control signal to be described later and the potential levels of the sense amplifier driving lines /SAN, SAP vary according to the signal SEN.

When the signal SEN is at the "H" level (power supply voltage VDD), the P-type sense amplifier 11 and the N-type sense amplifier 14 are operated. This operation is effected in the same manner as in a case of the readout operation for refreshing.

At time $t_1$, the potential of the word line $WL_0$ is changed from the ground potential VSS to a boosted potential VPP (for example, 5 V; VPP>VDD) obtained by raising the power supply voltage VDD and the potential of the first dummy word line $DWL_0$ is changed from the ground potential VSS to the power supply voltage VDD. As a result, data of the memory cell $MC_0$ is read out, and like the case of FIG. 14, the levels of the paired bit lines BL and /BL are changed. For example, the potentials of the paired bit lines which are previously precharged to 1.5 V are changed such that the potential of the bit line BL will be changed to 1.1 V and the potential of the bit line /BL will be changed to 1.5 V.

Then, when signal SEN is changed from VSS to VDD at time $t_2$, the levels of the signals of the sense amplifier driving lines /SAN, SAP are changed and the P-type and N-type sense amplifiers 11 and 14 are operated. As a result, a minute potential difference 0.4 between the paired bit lines is amplified by the sense amplifiers 11, 14. The bit lines BL, /BL are connected to the P-type sense amplifier 11 via the MOS transistors $Q_0$, $Q_1$. Therefore, voltage drops corresponding to the threshold voltages of the transistors occur in the transistors and the potential of the bit line /BL is raised to 2.5 V at maximum and the potential of the bit line BL is lowered to the ground potential VSS.

After the operations of the sense amplifiers 11, 14 are started, the potential of the second dummy word line $DWL_1$ is changed from VSS to VDD at time $t_3$. However, since the sense operation is already started, the potential variation will not influence the sense operation. The timing at which the second dummy word line $DWL_1$ is driven is not necessarily set at a point after the sense operation is stabilized and the potentials of the paired bit lines are stabilized, but may be set at a point while the potentials of the paired bit lines are being changed.

After this, data read out to the paired bit lines is transferred to the data line via the column selection gate. A case of a readout operation has been explained. In the case of a refresh operation, the data transferring operation is omitted. Further, in the case of a writing operation, write data is transferred to the paired bit lines.

Next, at time $t_4$, the potential of the word line $WL_0$ is restored from the boosted potential VPP to the ground potential VDD in response to a row control signal such as /RAS input from the exterior. After this, at time $t_5$, the equalizing operation for the paired bit lines is effected and the sense amplifier driving lines SAP, /SAN are activated to equalize the sense amplifiers. At this time, the potentials of the activated first and second dummy word lines $DWL_0$, $DWL_1$ are simultaneously restored from the power supply potential VDD to the ground potential VSS.

By the above operation, the active operation of one cycle is completed. In this case, the potential of the second dummy word line $DWL_1$ is returned from the power supply potential VDD to the ground potential VSS at time $t_5$. At this time, in the conventional case, the potential of the bit line /BL is raised towards VDD. However, in this embodiment, a rise in the potential of the bit line /BL is suppressed by the capacitive coupling with the dummy word line $DWL_1$ and the potential thereof is set to an intermediate potential. FIG. 3 shows the operations before and after the time $t_5$ in detail.

Thus, a rise in the potential of the bit line /BL can be substantially suppressed by activating the two dummy word lines at different timings.

In this embodiment, the timing for equalizing the paired bit lines, the timing for equalizing the sense amplifiers and the timing for lowering the potentials of the two dummy word lines are all set at the same timing. However, it is not necessary to set the above timings precisely equal to each other.

According to the above embodiment, the first dummy word line is driven to the power supply potential VDD before the sense amplifier starts the sense operation, the second dummy word line is driven to the power supply potential VDD after the sense amplifier has started the sense operation, and the first and second dummy word lines are returned to the ground potential VSS when the sense amplifier has terminated the sense operation. Therefore, since the first dummy word line adjusts the unbalance of the potentials of the paired bit lines when data is read out from the memory cell and the second dummy word line is activated during the operation of the sense amplifier, the data readout operation is not influenced. In addition, since the second dummy word line is set in the deactivated state after completion of the data readout operation, a rise in the potential of the second bit line can be prevented. As a result, the readout unbalance can be compensated for, delay in the recovery operation can be prevented, and high-speed operation can be attained. Further, the embodiment is suitable for low-voltage operation and deteriorations in various characteristics such as the pause time and refresh time can be prevented.

Next, one example of a row control system applied to a semiconductor memory device of this invention is explained with reference to FIGS. 4 to 12.

FIG. 4 shows the whole construction of the row control system. In FIG. 4, a row decoder 21, P-type sense amplifier driving circuit 22, VBL generator circuit 23, equalization control circuit 24, dummy word line control circuit 25 and N-type sense amplifier driving circuit 26 are the same as corresponding portions of FIG. 1 and the explanation therefor is omitted.

Further, the row control system includes a block selection circuit (BLSC) 31, row partial decoder (RPDC) 32, boost control circuit (BSCC) 33, timer circuit (TMC) 34, and sense amplifier control circuit (SACC) 35. The boost control circuit 33 generates a word line drive/control signal WLE at the VDD level and a word line drive signal WKM at the VPP level in response to /RAS at the word line driving time. The word line drive/control signal WLE and the word line drive signal WKM are supplied to the row partial decoder 32 and timer circuit 34. The row partial decoder 32 generates partial decoding signals $WDRV_0$, $WDRV_1$ used as a drive signal for the word line WL based on an externally supplied address signal Add, the word line drive/control signal WLE and the word line drive signal WKM. The partial decoding signals $WDRV_0$, $WDRV_1$ are supplied to the dummy word line control circuit 25 and the block selection circuit 31. The block selection circuit 31 generates partial decoding signals $PWDRV_0$, $PWDRV_1$ in the selected block based on a block selection signal BLS and the partial decoding signals $WDRV_0$, $WDRV_1$. The partial decording signals $PWDRV_0$, $PWDRV_1$ are supplied to the row decoder 21. The timer circuit 34 has a pseudo-row system for effecting the pseudo-operation of the word line and outputs signals WLUP and PWL based on the bit line precharge potential VBL output from the VBL generator circuit 23, the word line drive/ control signal WLE and the word line drive signal WKM.

The signals WLUP and PWL are explained later. The signal PWL is supplied to the equalization control circuit 24 and dummy word line control circuit 25. Further, the signals WLUP and PWL are supplied to the sense amplifier control circuit 35. The sense amplifier control circuit 35 outputs the signal SEN in response to the signals WLUP and PWL and the signal SEN is supplied to the sense amplifier driving circuits 22, 26.

Figure 5A:
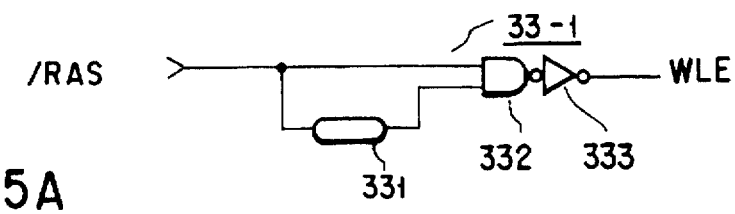
FIG. 5A is a circuit diagram showing part of a boost control circuit.

FIG. 5A shows a circuit 33-1 which is part of the boost control circuit 33 and generates a signal WLE in response to /RAS. The circuit includes a delay circuit 331 for delaying a fall of /RAS by a preset time, NAND gate 332 and inverter 333 and the signal WLE is output from the inverter 333.

Figure 5B:
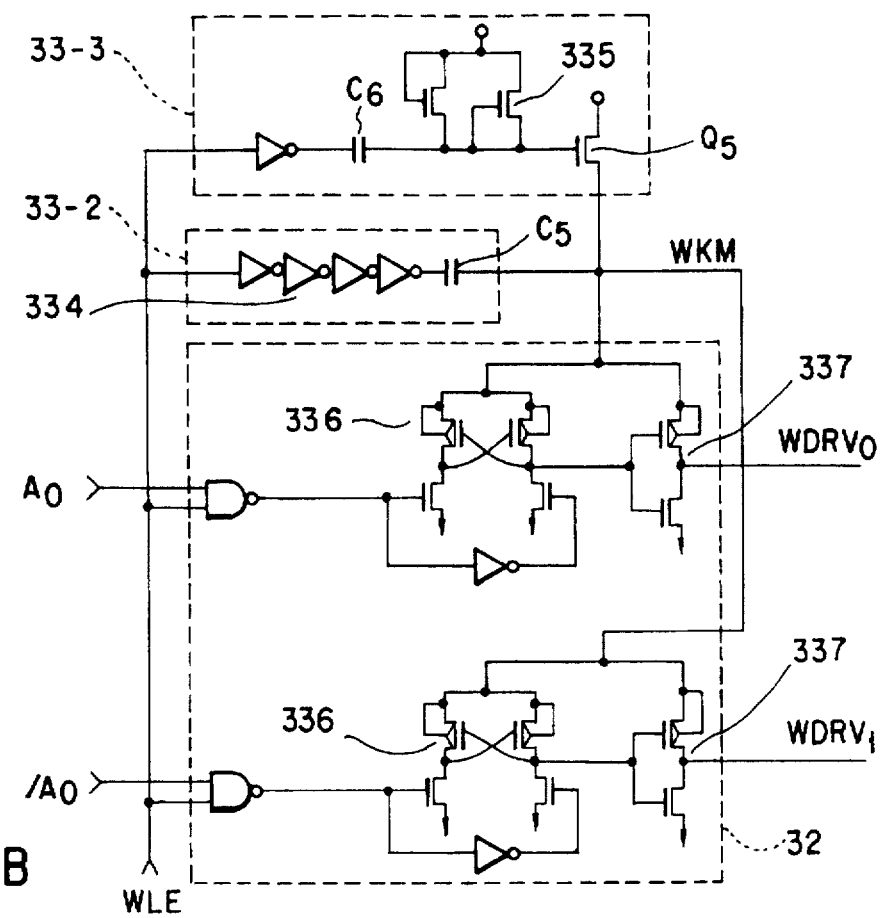
FIG. 5B is a circuit diagram showing part of a boost control circuit and partial decoder circuit.

FIG. 5B shows the construction of a booster circuit 33-2 and a circuit 33-3 for precharging a boost node acting as the remaining portion of the boost control circuit 33, and the row partial decoder 32. The booster circuit 33-2 includes an inverter chain 334 having a plurality of inverter circuits serially connected and a capacitor C5 and generates a boosted voltage VPP. The circuit 33-3 is connected to the booster circuit 33-2, and mainly includes a capacitor C6, a charging circuit 335 constructed by two transistors and a precharge transistor Q5, and precharges the boost node.

The row partial decoder 32 includes a plurality of level converter circuits 336 and drive circuits 337 constructed by CMOS inverters. The two level converter circuits 336 respectively decode address signals A0 and /A0 and convert the levels of the decoded outputs by use of a boost voltage supplied from the boosted circuit 33-2. The drive circuits 337 output partial decoding signals $WDRV_0$, $WDRV_1$ in response to output signals of the level converter circuits 336.

Figure 6:
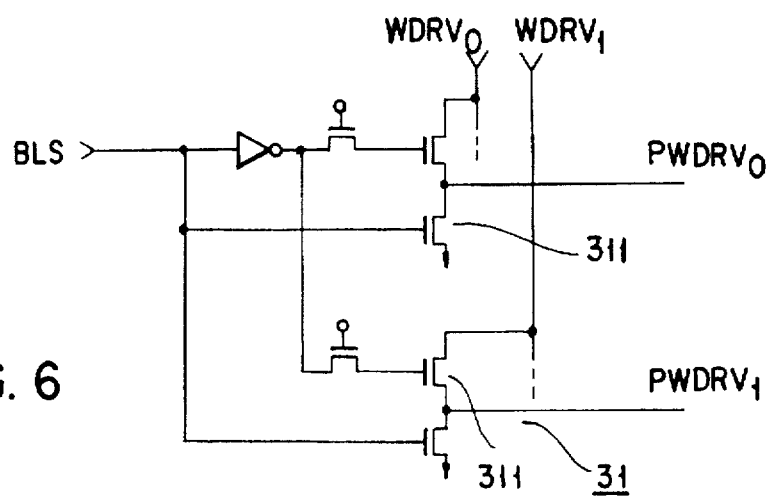
FIG. 6 is a circuit diagram showing a block selection circuit.

FIG. 6 shows the block selection circuit 31. The block selection circuit 31 includes a plurality of bootstrap type transfer gates 311. The transfer gates 311 receive the partial decoding signals $WDRV_0$, $WDRV_1$ and output partial decoding signals $PWDRV_0$, $PWDRV_1$ in the selected block in response to the block selection signal BLS.

FIG. 7 shows the circuit construction of the row decoder 21. The row decoder 21 includes a plurality of row address decoders 212 and a plurality of word line drive circuits 211. Each row address decoder 212 is controlled by address signals A, B, C and precharge signal PRE. Each word line drive circuit 211 includes a bootstrap type transfer gate supplied with an output signal of a corresponding one of the row address decoders 212 and the partial decoding signals $PWDRV_0$, $PWDRV_1$ and the word line drive circuits 211 select a word line according to the output signals of the row address decoders 212 and supply one of the partial decoding signals $PWDRV_0$ and $PWDRV_1$ to the selected word line.

FIG. 8 shows the circuit construction of the timer circuit 34. The timer circuit 34 includes a pseudo-word line drive circuit 34-1 for effecting the pseudo-operation of the word line, pseudo-word line 34-2, and two word line potential detecting circuits 34-3, 34-4. The pseudo-word line drive circuit 34-1 receives a signal WLE, a signal WKM and a precharge signal PRE to drive the pseudo-word line 34-2. In order to obtain the delay time equivalent to that of the real word line drive circuit system, the number of transistors connected between the booster circuit and the pseudo-word line 34-2 is set to the same as the number of transistors used in the case of real word line drive circuit system. The pseudo-word line 34-2 comprises the capacitance and resistance components equivalent to the word line WL. The detecting circuit 34-3 includes two inverter circuits connected to the pseudo-word line 34-2 and outputs a signal PWL which is delayed by a preset time for defining the time $t_3$ shown in FIG. 2. The detecting circuit 34-4 is connected to the pseudo-word line 34-2. The detecting circuit 34-4 includes a comparator circuit 341, level lowering circuit 342, and wave shaping circuit 343. The level lowering circuit 342 outputs a voltage lowered from the potential of the pseudo-word line 34-2 by a threshold voltage of the MOS transistor. The comparator circuit 341 compares the output potential of the level lowering circuit 342 with the precharge potential VBL of the bit line and outputs a signal WLUP of VDD level when the former is higher than the latter.

FIG. 12 shows the VBL generating circuit 23 for generating a precharge potential VBL. The circuit includes a reference potential generating circuit section 231 and drive section 232. The reference potential generating circuit section 231 includes a plurality of resistors and transistors connected between the power supply and the ground and generates two reference potentials. The drive section 232 includes two transistors connected between the power supply and the ground. The transistors are controlled by the reference potentials supplied from the reference potential generating circuit section 231 and the precharge potential VBL is generated from a connection node between the transistors.

FIG. 9 shows the circuit construction of the sense amplifier control circuit 35 and sense amplifier drive circuits 22, 26. The sense amplifier control circuit 35 includes a NAND gate 351 supplied with signals PWL and WLUP and an inverter chain 352 constructed by a plurality of inverters serially connected and the sense amplifier drive/control signal SEN is output from the inverter chain 352. The sense amplifier drive circuits 22, 26 respectively include charging/discharging circuits 221, 222 and equalizing circuits 223. The sense amplifier drive/control signal SEN is supplied to the gate of a P-channel transistor constructing the charging/discharging circuit 221 via a NAND gate and to the gate of an N-channel transistor constructing the charging/discharging circuit 222. Each of the gates of N-channel transistors constructing the equalizing circuits 223 and one end of each of the N-channel transistors are respectively supplied with the equalizing signal EQ and bit line precharge potential VBL.

FIG. 10 shows the circuit construction of the equalization control circuit 24. The equalization control circuit 24 includes inverter circuits 241, 242 and NAND gate 243 and generates an equalizing signal EQ according to the signals /RAS and PWL.

FIG. 11 shows the dummy word line control circuit 25. The dummy word line control circuit 25 includes a timing circuit 25-1 and drive circuit 25-2. The timing circuit 25-1 generates a signal DWLE for defining the timing corresponding to the time $t_3$ shown in FIG. 2 after the sense amplifier has started the sense operation in response to the sense amplifier drive/control signal SEN and the signal PWL. The drive circuit 25-2 outputs the partial decoding signals $WDRV_0$, $WDRV_1$ as $DWL_0$, $DWL_1$ according to the signal DWLE.

Next, the operation of the dummy word line control circuit 25 is explained with reference to FIG. 2. The signal DWLE is set at the low level at time $t_1$. At this time, if one of the signals $WDRV_0$ and $WDRV_1$ is changed to VDD, one of the dummy word lines $DWL_0$ and $DWL_1$ is driven to VDD. After the sense amplifier is activated, if the signal DWLE is changed to VDD at time $t_3$, both of the dummy word lines $DWL_0$ and $DWL_1$ are driven to VDD.

The above-described row control system has the following advantage.

The timer circuit 34 has a pseudo-word line 34-2. Therefore, the potential of the real word line can be precisely monitored based on the potential of the pseudo word line and various control signals can be generated at proper timings. Since the time $t_3$ is determined by use of the thus generated signals PWL, WLUP, the drive timing of the second dummy word line can be precisely controlled. This is suitable in a case where two dummy word lines are driven at different timings as in this invention.

This invention is not limited to the above embodiment and can be variously modified without departing from the technical scope thereof. For example, it is possible to drive the word line at the VPP level and drive the dummy word line at the VPP level.

Further, in the above embodiment, a case wherein the readout sensitivity for data "1" is enhanced is explained. However, this invention is not limited to this case and it is possible to enhance the readout sensitivity for data "0" according to the structure of the memory cell. Even in this case, it will not be necessary to make a substantial change in the above embodiment. A concrete method for enhancing the readout sensitivity for data "0" is as follows. That is, the potential of a dummy word line connected to a selected bit line is lowered from the "H" level to the "L" level before the bit line sensing operation, and after starting the bit line sensing operation, the potential of a dummy word line connected to a nonselected bit line is lowered from the "H" level to the "L" level. When the active period of /RAS is terminated and the precharge period starts, the potentials of both of the dummy word lines are raised from the "L" level to the "H" level. Thus, the readout sensitivity for data "0" can be enhanced.

Further, in the above explanation, an example in which the operation of the internal circuit is synchronized with /RAS is described. However, this does not mean that the construction controlled by use of an external clock cannot be used. It is also possible to use the construction controlled by use of an external clock.

What is claimed is:

1. A semiconductor memory device comprising:

a bit line pair having first and second bit lines;

a plurality of word lines arranged to cross said first and second bit lines;

a plurality of memory cells connected to said first and second bit lines and to said word lines, one of said memory cells being selected by one of said word lines;

an equalizing circuit for equalizing the potentials of said first and second bit lines to a preset potential;

a first MOS transistor having a current path connected at one end to said first bit line and a gate connected to said second bit line;

a second MOS transistor having a current path connected at one end to said second bit line and a gate connected to said first bit line, the other end of the current path of said second MOS transistor being connected to the other end of the current path of said first MOS transistor;

a first dummy word line capacitively coupled to said first bit line;

a second dummy word line capacitively coupled to said second bit line;

a selection circuit for selecting one of said plurality of word lines;

a sense amplifier driving circuit for performing a first driving operation by driving the other ends of the current paths of said first and second MOS transistors to a first potential, and after terminating the first driving operation, performing a second driving operation by driving the other ends of the current paths of said first and second MOS transistors to a second potential, which is different from the first potential; and a dummy word line driving circuit, wherein when data of one of the memory cells connected to said first bit line is read out, said dummy word line driving circuit activates said first dummy word line before the first driving operation, activates said second dummy word line after the first driving operation and before the second driving operation, and deactivates both said first and second dummy word lines at substantially the same time as the second driving operation.

2. The semiconductor memory device according to claim 1, wherein when data of one of the memory cells connected to said second bit line is read out, said dummy word line driving circuit activates said second dummy word line before the first driving operation, activates said first dummy word line after the first driving operation and before the second driving operation, and deactivates both said first and second dummy word lines at substantially the same time as the second driving operation.

3. The semiconductor memory device according to claim 1,
wherein said first and second bit lines are each divided in first and second regions,
said memory cells are selectively connected to said first and second bit lines,
said first and second MOS transistors are connected to portions of said first and second bit lines which lie in said second region, and
transfer gate circuits connect portions of said first and second bit lines which lie in said first region to portions of said first and second bit lines which lie in said second region.

4. The semiconductor memory device according to claim 1, further comprising:
a booster circuit for generating a boosted voltage by raising a power supply voltage;
a decoder for receiving an address signal and the boosted voltage from said booster circuit and generating a drive signal for driving said word line according to the address signal; and
a timer circuit including a pseudo-word line circuit that has a delay time corresponding to the drive timing for said word line, said timer circuit being connected to receive the boosted voltage from said booster circuit and output a timing signal which defines a time when said second dummy word line is to be activated.

5. The semiconductor memory device according to claim 1, wherein the first potential is higher than the second potential.

6. The semiconductor memory device according to claim 1, wherein said memory cell includes a capacitor having a plate electrode supplied with a predetermined potential and a storage node formed of semiconductor doped with an impurity.

7. The semiconductor memory device according to claim 1, wherein the data readout operation is a readout operation for refreshing.

8. A semiconductor memory device comprising:
a pair of bit lines to which a plurality of memory cells and a sense amplifier are connected;

two dummy word lines, each of the dummy word lines being capacitively coupled to a corresponding one of the bit lines of said pair of bit lines; and
a controller that controls the two dummy word lines,
wherein the controller activates one of said dummy word lines before said sense amplifier starts a sense operation for the pair of bit lines, activates the other dummy word line after said sense amplifier has started the sense operation, and deactivates both of said dummy word lines at the same time as or after said sense amplifier terminates the sense operation.

9. The semiconductor memory device according to claim 8, wherein the controller activates one of the dummy lines by driving it to a first potential, the controller deactivates one of the dummy lines by driving it to a second potential, and the first potential is higher than the second potential.

10. The semiconductor memory device according to claim 8, wherein said memory cell includes a capacitor having a plate electrode supplied with a preset potential and a storage node formed of semiconductor doped with an impurity.

11. A semiconductor memory device comprising:
a first bit line to which DRAM cells are connected;
a second bit line;
a first signal line capacitively coupled with said first bit line;
a second signal line capacitively coupled with said second bit line;
an equalizing circuit for equalizing said first and second bit lines during a precharge cycle;
a sense amplifier circuit for sensing and amplifying a potential difference between said first and second bit lines; and
a control circuit for selectively reading out data from one of said DRAM cells to said first bit line,
wherein said control circuit activates said first signal line before the operation of said sense amplifier, activates said second signal line after the operation of said sense amplifier, and deactivates said first and second signal lines in the precharge cycle.

12. The semiconductor memory device according to claim 11, wherein said control circuit deactivates said first and second signal lines at the same time as the starting of the equalizing operation by said equalizing circuit.

13. The semiconductor memory device according to claim 11, wherein the data readout operation is a readout operation for refreshing.

14. A control method for a semiconductor memory device of the type having a pair of bit lines to which a plurality of memory cells and a sense amplifier are connected and two dummy word lines capacitively coupled to the pair of bit lines, said control method comprising the steps of:
driving one of the dummy word lines to a first potential before the sense amplifier starts a sense operation for the pair of bit lines;
driving the other dummy word line to the first potential after the sense amplifier has started the sense operation; and
driving the two dummy word lines to a second potential at the same time as or after the sense amplifier terminates the sense operation.

15. The control method according to claim 14, wherein the first potential is higher than the second potential.

16. The control method according to claim 14, wherein the memory cell includes a capacitor having a plate electrode supplied with a preset potential and a storage node formed of semiconductor doped with an impurity.

17. The control method according to claim 14, wherein the sense amplifier is operated to read out data from the memory cell.

18. The control method according to claim 14, wherein the sense amplifier is operated to refresh the memory cell.

19. The control method according to claim 14, wherein the first dummy word line adjusts an imbalance between potentials of the pair of bit lines when data is read out from the memory cell.

20. The control method according to claim 14, wherein the sense operation of the sense amplifier is not changed when the second dummy word line is activated.

* * * * *